(12) United States Patent
Liao et al.

(10) Patent No.: US 12,218,298 B2
(45) Date of Patent: Feb. 4, 2025

(54) DISPLAY PANEL AND METHOD FOR MAKING THE SAME

(71) Applicant: HON HAI PRECISION INDUSTRY CO., LTD., New Taipei (TW)

(72) Inventors: Chin-Yueh Liao, New Taipei (TW); Hui-Chu Lin, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 453 days.

(21) Appl. No.: 17/725,777

(22) Filed: Apr. 21, 2022

(65) Prior Publication Data

US 2023/0032729 A1 Feb. 2, 2023

(30) Foreign Application Priority Data

Aug. 2, 2021 (CN) .......................... 202110882812.3

(51) Int. Cl.
*H01L 33/62* (2010.01)
*H01L 25/075* (2006.01)
*H01L 33/00* (2010.01)
*H01L 33/38* (2010.01)

(52) U.S. Cl.
CPC .......... *H01L 33/62* (2013.01); *H01L 25/0753* (2013.01); *H01L 33/005* (2013.01); *H01L 33/382* (2013.01); *H01L 2933/0016* (2013.01); *H01L 2933/0066* (2013.01)

(58) Field of Classification Search
CPC ..... H01L 33/62; H01L 33/005; H01L 33/382; H01L 25/0753; H01L 2933/0016; H01L 2933/0066
USPC .......................................................... 257/79
See application file for complete search history.

(56) References Cited

U.S. PATENT DOCUMENTS 12,021,167 B2 * 6/2024 Oh ........................ H01L 25/167

FOREIGN PATENT DOCUMENTS

| CN | 110265454 A | 9/2019 |
|---|---|---|
| CN | 209691787 U | 11/2019 |

* cited by examiner

*Primary Examiner* — Tu-Tu V Ho
(74) *Attorney, Agent, or Firm* — ScienBiziP, P.C.

(57) ABSTRACT

A display panel includes a substrate, a plurality of conductive components on a surface of the substrate, a plurality of light-emitting diodes. The conductive components are on a surface of the substrate and spaced apart from each other. Each conductive component includes a first conductive part and a second conductive part. The second conductive part is electrically connected to the first conductive part. A projection of the second conductive part on the surface at least partially overlaps a projection of the first conductive part on the surface. Each light-emitting diode includes a binding electrode, and the binding electrode is electrically connected to the second conductive part. The first conductive part is made of metal; the second conductive part is made of a transparent conductive oxide. The binding electrode is made of metal. A eutectic material is formed between the second conductive part and the binding electrode.

13 Claims, 11 Drawing Sheets

DISPLAY PANEL AND METHOD FOR MAKING THE SAME

FIELD

The subject matter herein generally relates to display field, particularly relates to a display panel and a method for making the display panel.

BACKGROUND

Inorganic light emitting diodes (LEDs) are used as active light-emitting elements of the display panel. The LEDs are usually fixed on a substrate of the display panel by binding materials. The above binding materials are set on the substrate, and then the LEDs are set on the binding material. When the LED is a micro LED or a mini LED, due to the small size of these two types of LEDs (less than 200 μm), the binding materials usually cannot bind the LED well, so the LED may be dislocated. A better binding effect may be achieved by using more binding materials, but this increases the production cost.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
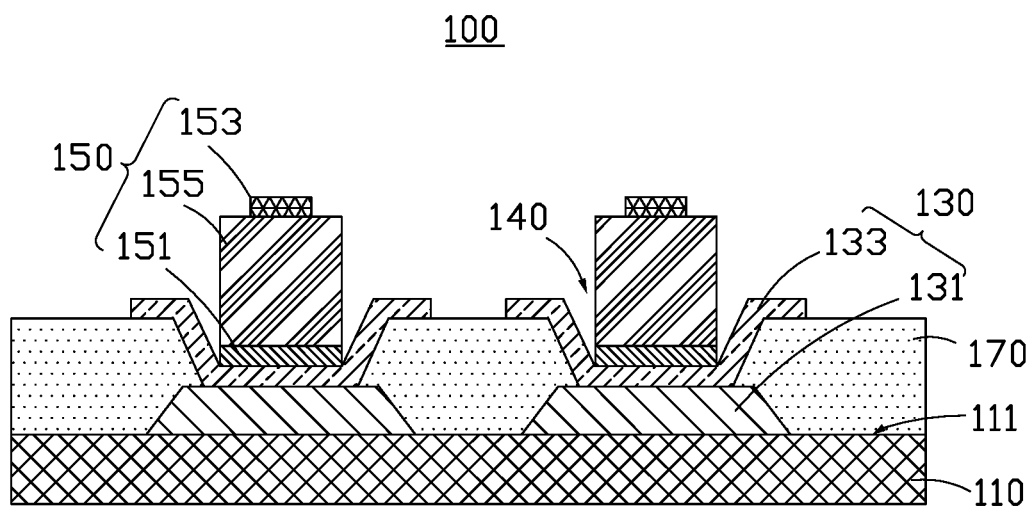
FIG. 1 is a cross-sectional view of a display panel according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

First Embodiment

FIG. 1 illustrates a display panel 100. The display panel 100 includes a substrate 110, a plurality of conductive components 130, a plurality of light-emitting diodes (LEDs) 150, and an insulating layer 170. Each conductive component 130 includes a first conductive part 131 and a second conductive part 133. Each LED 150 includes a binding electrode 151, an upper electrode 153, and a light-emitting part 155 between the binding electrode 151 and the upper electrode 153.

In this embodiment, the conductive components 130 are on a surface 111 of the substrate 110 and spaced apart from each other. The first conductive part 131 of each conductive component 130 is on the surface 111 of the substrate 110, and the second conductive part 133 is formed on a side of the first conductive part 131 away from the substrate 110. The second conductive part 133 partially covers the first conductive part 131. The binding electrode 151 of each LED 150 is electrically connected to the second conductive part 133. The insulating layer 170 is arranged on the surface 111 of the substrate 110 and partially covers each first conductive part 131. The insulating layer 170 defines a plurality of positioning holes 140. The first conductive part 131 is partially exposed relative to the insulating layer 170 by one positioning hole 140. The second conductive part 133 is formed in the positioning hole 140 and covers the first conductive part 131 aligned with the positioning hole 140. Each LED 150 is positioned in one positioning hole 140.

The first conductive part 131 is made of metal, and the second conductive part 133 is made of a transparent conductive oxide. In this embodiment, the transparent conductive oxide is indium tin oxide (ITO). In other embodiments, the material of the second conductive part 133 may also be other transparent conductive oxide. In this embodiment, the binding electrode 151 is made of indium, and a eutectic material alloy is formed between the binding electrode 151 and the second conductive part 133. In other embodiments, the binding electrode 151 can also be tin or other metal materials that can form a eutectic material with the transparent conductive oxide of the second conductive part 133.

In this embodiment, the LED 150 is a micro light-emitting diode having a size less than 100 microns. In other embodiments, the LED 150 may also be a mini light-emitting diode having a size of about 100 microns to 200 microns.

In this embodiment, the second conductive part 133 is directly bound to the binding electrode 151 of the LED 150. That is, the second conductive part 133 acts as an adhesive. Compared with adhesive containing silver or other conductive adhesive, the second conductive part 133 can form a eutectic material with stronger adhesion between the second conductive part 133 and the binding electrode 151 of the LED 150, so as to improve adhesion of the LED 150.

Figure 2:
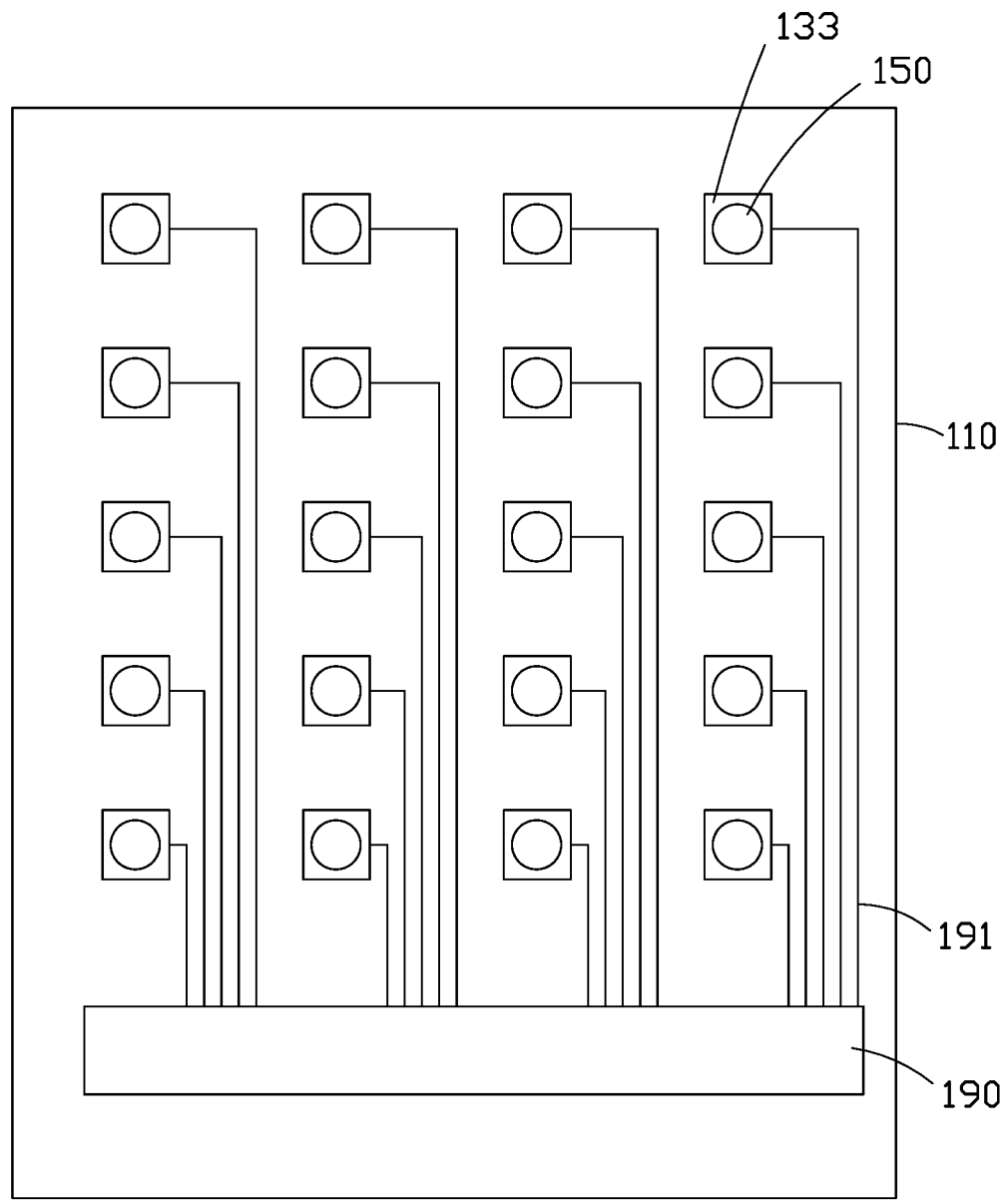
FIG. 2 is a top view of the display panel of FIG. 1.

In this embodiment, as shown in FIG. 2, circuit wires 191 for connecting each conductive component 130 to a control chip 190 are provided on the substrate 110. The control chip 190 and the circuit wires 191 are used to provide electrical signals to each conductive component 130, so as to input a voltage signal to the binding electrode 151 of each LED 150. The display panel 100 also includes a plurality of common electrodes (not shown) electrically connected to the upper electrode 153 of each LED 150. The common electrodes are used to provide a voltage signal to the upper electrode 153 of each LED. The voltage signals on the binding electrode 151 and the upper electrode 153 of the LED 150 act to make the light-emitting part 155 of the LED 150 emit light.

Figure 3:
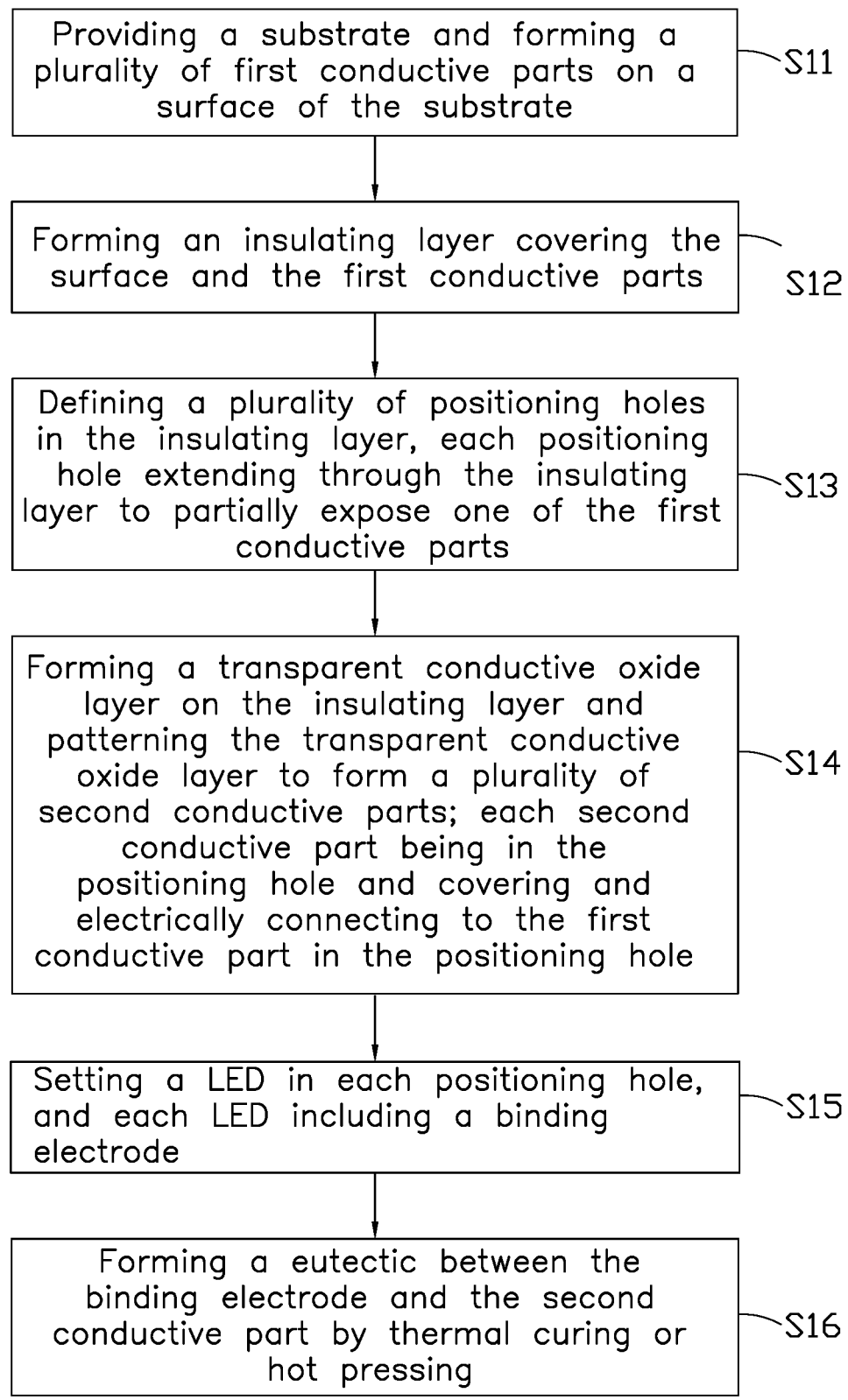
FIG. 3 is a flow chart of a method in a first embodiment for making the display panel of FIG. 1.

As shown in FIG. 3, a method for making the display panel 100 is also provided. The method includes following step S11 to step S16.

Step S11: providing a substrate 110 and forming a plurality of first conductive parts 131 spaced apart from each other on a surface 111 of the substrate 110.

Step S12: forming an insulating layer 170. The insulating layer 170 covers both the surface 111 and the first conductive parts 131.

Step S13: defining a plurality of positioning holes 140 in the insulating layer 170. Each positioning hole 140 extends through the insulating layer 170 to partially expose one of the first conductive parts 131.

Step S14: forming a transparent conductive oxide layer 1330 on the insulating layer 170 and patterning the transparent conductive oxide layer 1330 to form a plurality of second conductive parts 133. Each second conductive part 133 is formed in one positioning hole 140 and covers and is electrically connected to the first conductive part 131.

Step S15: setting a LED 150 in each positioning hole 140. Each LED 150 includes a binding electrode 151.

Step S16: forming a eutectic material between the binding electrode 151 and the second conductive part 133 by thermal curing or hot pressing.

Figure 4:
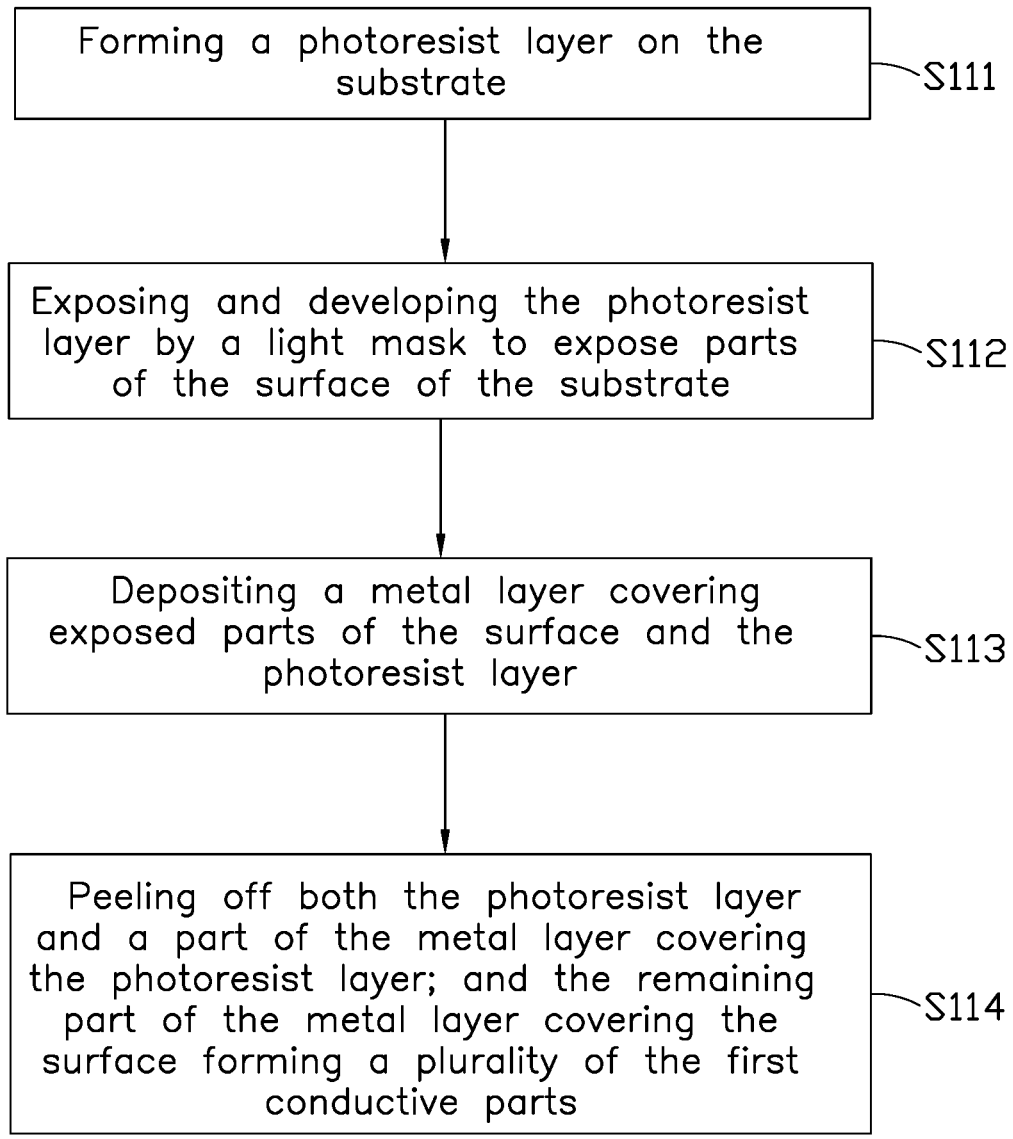
FIG. 4 illustrates step S11 in the method of FIG. 3.

In this embodiment, as shown in FIG. 4, the step S11 further includes step S111 to Step 114.

Step S111: forming a photoresist layer on the substrate 110.

Step S112: exposing and developing the photoresist layer by a light mask.

Step S113: depositing a metal layer covering exposed parts of the surface 111 and the photoresist layer.

Step S114: peeling off both the photoresist layer and a part of the metal layer covering the photoresist layer. The remaining part of the metal layer covering the surface 111 forms a plurality of the first conductive parts 131.

In this embodiment, the steps S111 to S114 are used to form the first conductive parts. By setting the photoresist layer on the substrate and etching the photoresist layer by exposure and developing, the metal layer can be patterned more accurately to obtain the first conductive parts with a more accurate size and shape.

Figure 5:
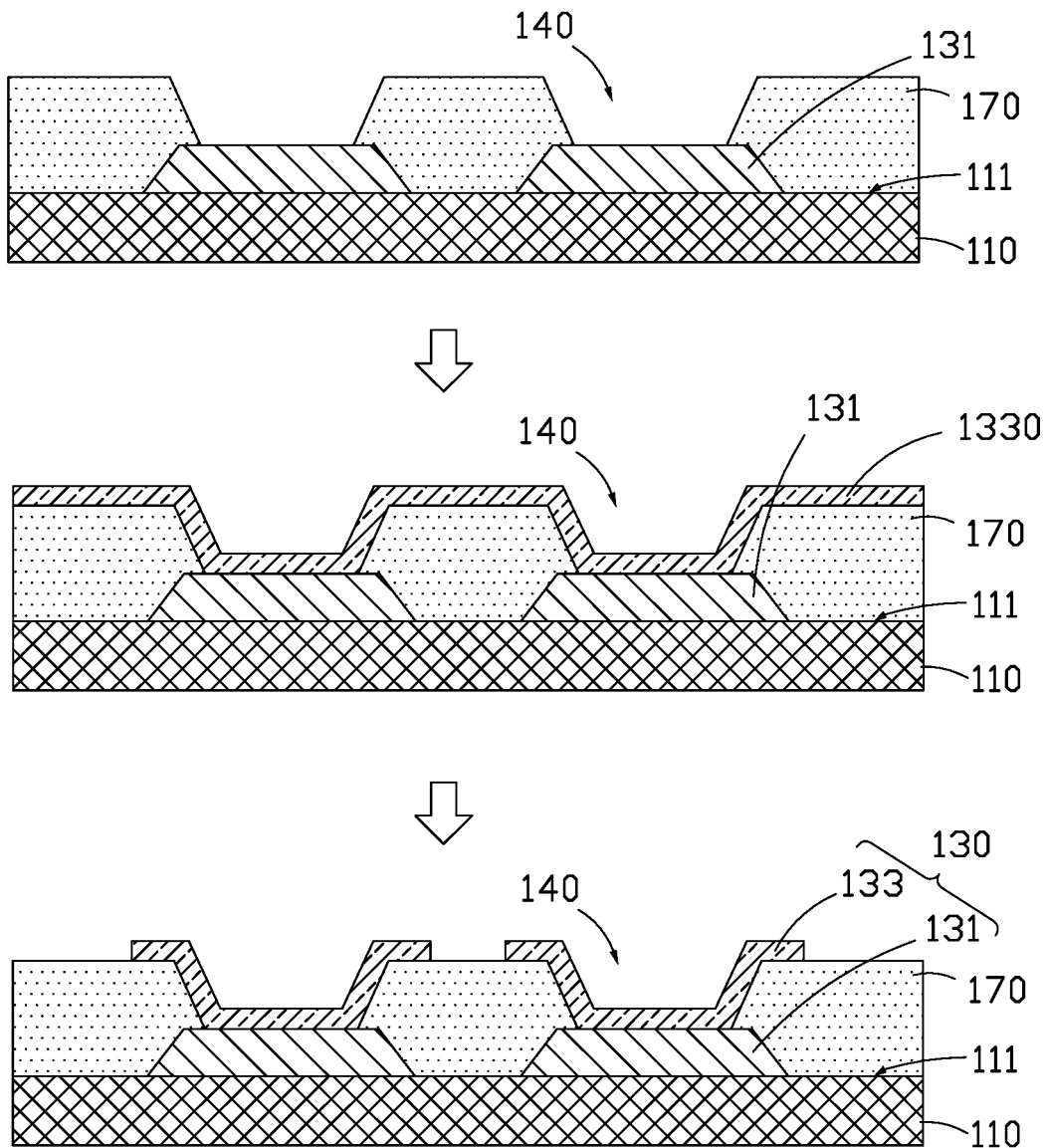
FIG. 5 illustrates cross-sectional views in different stages of step S14 in FIG. 3.

As shown in FIG. 5, in this embodiment, step S14 forms a plurality of second conductive parts 133 spaced apart from each other by setting a patterned mask (not shown) above the transparent conductive oxide layer 1330 and performing exposure etching of the transparent conductive oxide layer 1330.

In this embodiment, the LED 150 can be a micro LED. In step S15, many micro-LEDs are transferred into the plurality of positioning holes 140 by a mass transfer method. In other embodiments, the LED 150 may also be a mini-LED, and step S15 may comprise transferring many mini LEDs into the positioning holes 140 by a vacuum grasping process.

The second conductive parts 133 are formed by patterning, which can more accurately control an amount of material of the second conductive part 133 in each positioning hole 140, better for saving the cost compared with the existing method of dispensing binding materials (such as silver paste, solder, etc.). By using the transparent conductive oxide as a part of the conductive component 130, a eutectic material can be formed between the second conductive part 133 and the binding electrode 151 by thermal curing or hot pressing, so as to improve the binding effect.

Second Embodiment

Figure 6:
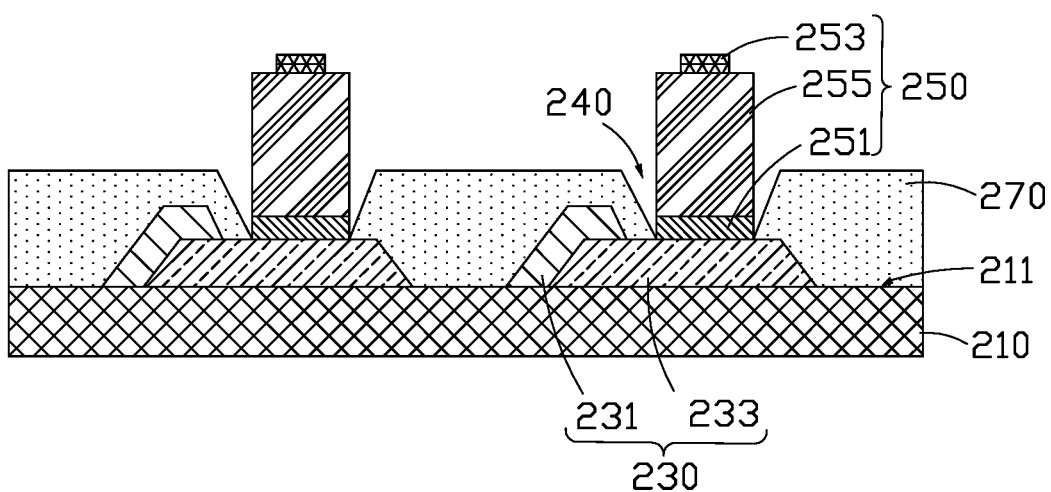
FIG. 6 is a cross-sectional view of a display panel according to a second embodiment of the present disclosure.

FIG. 6 illustrates a display panel 200. The display panel 200 includes a substrate 210, a plurality of conductive components 230, a plurality of LEDs 150, and an insulating layer 270. Each conductive component 230 includes a first conductive part 231 and a second conductive part 233. Each LED 250 includes a binding electrode 251, an upper electrode 253, and a light-emitting part 255 between the binding electrode 251 and the upper electrode 253.

In this embodiment, the conductive components 230 are on a surface 211 of the substrate 210 and spaced apart from each other, and the second conductive part 233 of each conductive component 230 is arranged on the surface 211 of the substrate 210. The first conductive part 231 is arranged on the second conductive part 233, and the first conductive part 231 partially covers the second conductive part 233 and extends from a side of the second conductive part 233 to contact the surface 211 of the substrate 210. Each LED 250 is connected to a portion of the second conductive part 233 which is not covered by the first conductive part 231. The insulating layer 270 is arranged on the substrate 210 and completely covers each first conductive part 231 and a part of each second conductive part 233. The insulating layer 270 defines a plurality of positioning holes 240. Each second conductive part 233 is exposed from the insulating layer 270 by one positioning hole 240, and each LED 250 is positioned in one positioning hole 240.

The first conductive part 231 is made of metal, and the second conductive part 233 is made of a transparent conductive oxide. In this embodiment, the transparent conductive oxide is indium tin oxide (ITO). In other embodiments, the second conductive part 233 can also be made of other transparent conductive oxide. In this embodiment, the material of the binding electrode 251 is indium, and a eutectic material is formed between the binding electrode 251 and the second conductive part 233. In other embodiments, the material of the binding electrode 251 can also be tin or other metal materials that can form a eutectic material with the transparent conductive oxide of the second conductive part 233.

Compared with the first embodiment, in this embodiment, the second conductive part 233 is arranged on the substrate 210, and the first conductive part 231 is not overlapped with the LED 250, this eliminates the requirement of the first conductive part 231 for the projection area on the substrate 210. That is, a projection area of the first conductive part 231 of the display panel 200 on the surface 211 is less than a projection area of the second conductive part 233 on the surface 211. Thus, overall light transmittance of the display panel 200 is expanded and improved.

In this embodiment, the LED 250 is a micro light-emitting diode having a size less than 100 microns. In other embodiments, the LED 250 may also be a mini light-emitting diode having a size of about 100 microns to 200 microns.

Figure 7:
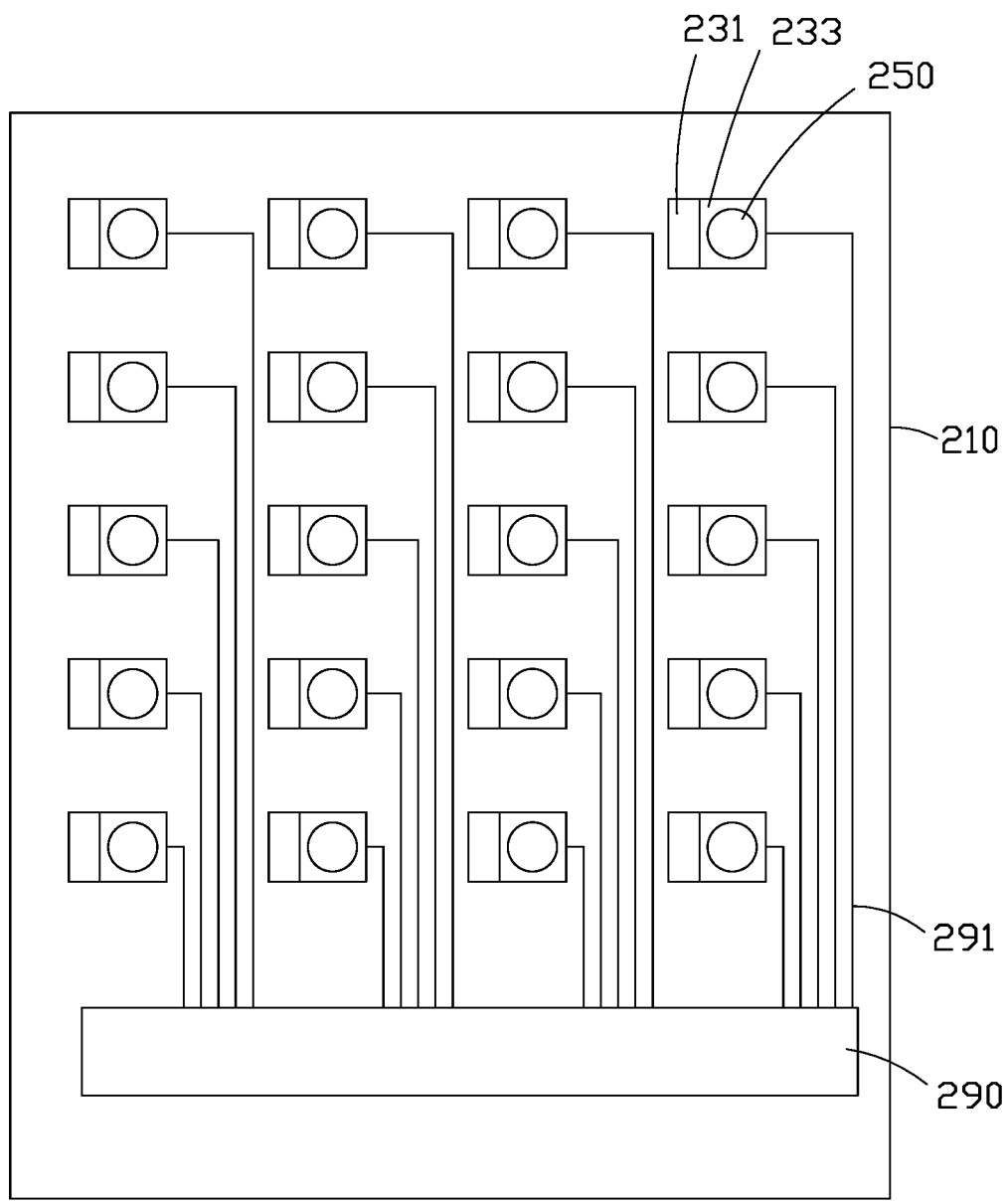
FIG. 7 is a top view of the display panel of FIG. 6.

In this embodiment, as shown in FIG. 7, each conductive component 230 is bound to one LED 250. Circuit wires 291 are provided on the substrate 210 for connecting each conductive component 230 to a control chip 290. The control chip 290 and circuit wires 291 are used to provide electrical signals to each conductive component 230, so as to input a voltage signal to the binding electrode 251 of each LED 250. The display panel 200 also includes common electrodes (not shown), electrically connected to the upper electrode 253 of each LED 250. The common electrode is used to provide voltage signals to the upper electrode 253 of each LED 250, and the voltage signals on the binding electrode 251 and the upper electrode 253 of the LED 250 act to make the light-emitting part 255 of the LED 250 emit light.

Figure 8:
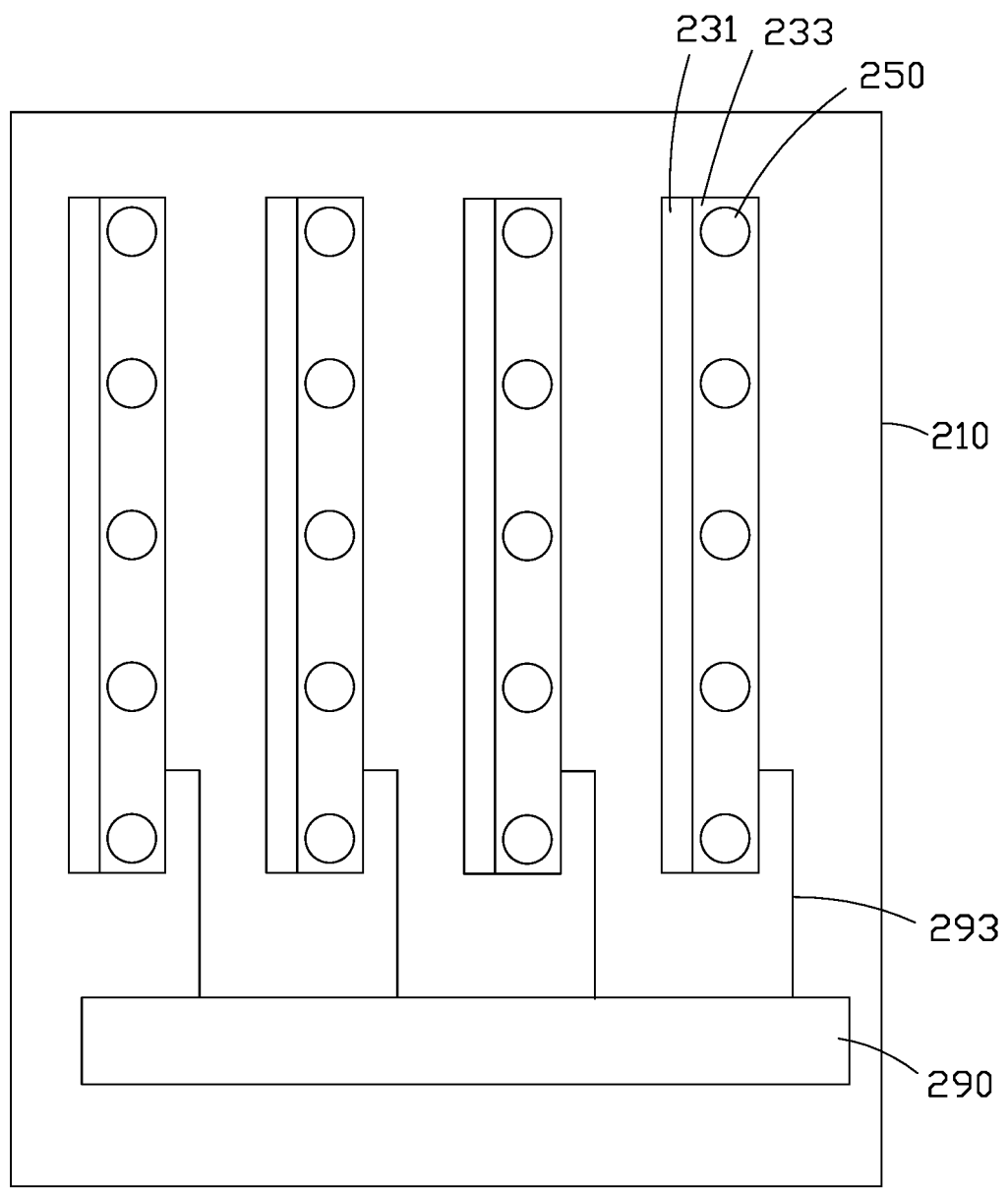
FIG. 8 is a top view of a display panel according to another embodiment of the present disclosure.

In other embodiments, as shown in FIG. 8, each conductive component 230 can also be bound to several LEDs 250. The display panel 200 also includes circuit wires (not shown) for connecting each conductive component 230 to a control chip 290 and circuit wires 293 for connecting the upper electrode 253 of each LED 250 to the control chip 290. The control chip 290 is used to provide voltage signals to the upper electrode 253 and binding electrode 251 of each LED 250 to make the LED 250 emit light.

In this embodiment, the first conductive part 231 partially covers a side of the second conductive part 233 and is electrically connected to the second conductive part 233, thus the first conductive part 231 and the second conductive part 233 form a parallel relationship with respect to the LED 250. Compared with the case where the LEDs 150 are connected in series with the second conductive part 133 and the first conductive part 131 in the first embodiment, the mode of setting of this embodiment reduces the overall resistance of the conductive component 230. Thus, impedance between the LED 250 and the conductive component 230 is reduced.

In other embodiments, the first conductive part 231 may also be arranged to cover more than one side of the second conductive part 233, or the setting can be done in other ways for a parallel connection with the second conductive part 233.

Figure 9:
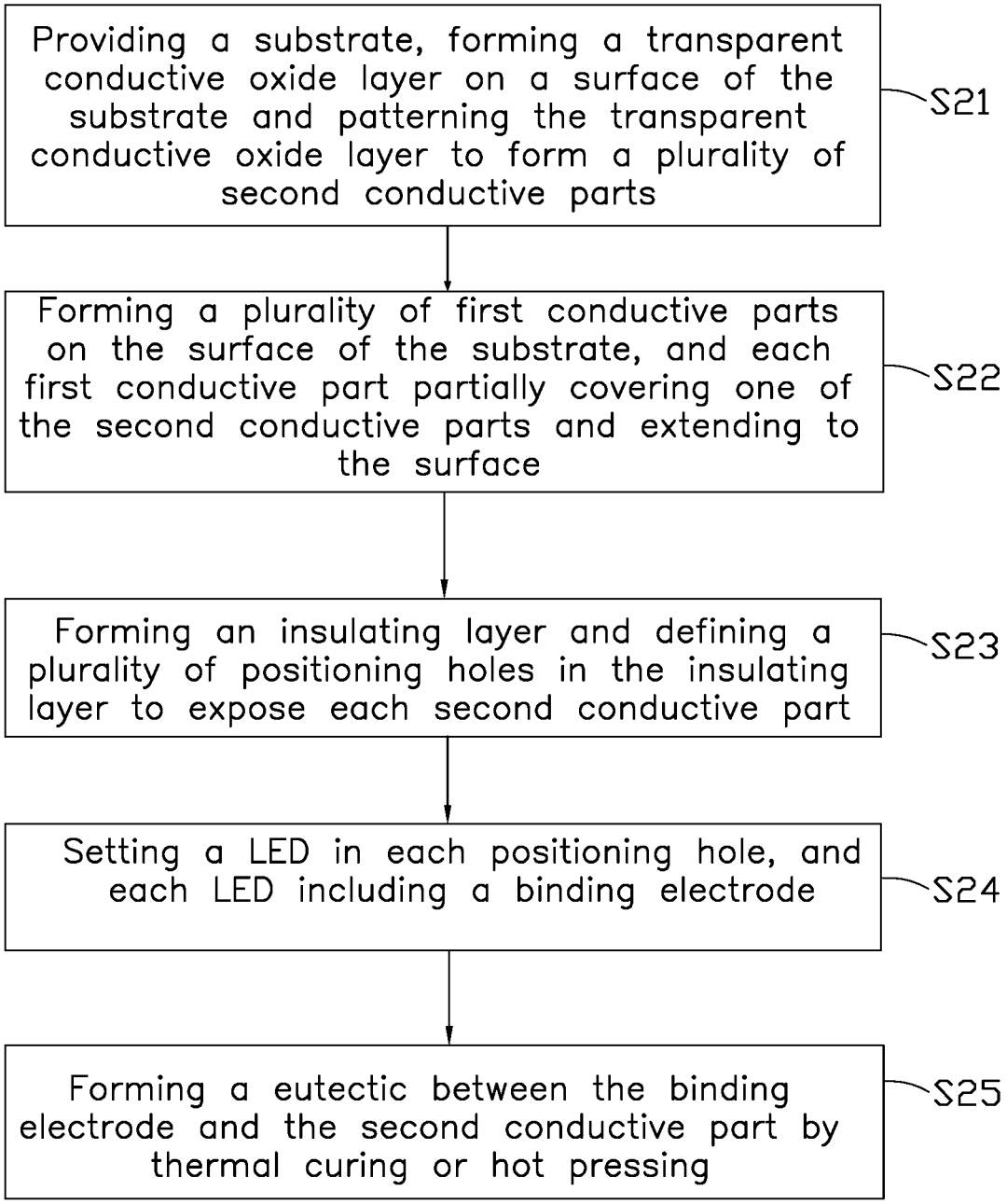
FIG. 9 is a flow chart of a method for making the display panel of the second embodiment in FIG. 6.

As shown in FIG. 9, a method for making the display panel 200 includes the following step S21 to step S25.

Step S21: providing a substrate 210, forming a transparent conductive oxide layer 2330 on a surface 211 of the substrate 210, and patterning the transparent conductive oxide layer 2330 to form a plurality of second conductive parts 233.

Step S22: forming a plurality of first conductive parts 231 on the surface 211 of the substrate 210, each first conductive part 231 partially covering one second conductive part 233 and extending to contact the surface 211.

Step S23: forming an insulating layer 270 on the surface 211 of the substate 210 and defining a plurality of positioning holes 240 in the insulating layer 270 to expose each second conductive part 233.

Step S24: setting an LED 150 in each positioning hole 140, each LED including a binding electrode 151.

Step S25: forming a eutectic material between the binding electrode 151 and the second conductive part 133 by thermal curing or hot pressing.

In this embodiment, the step S21 further includes setting a patterned mask (not shown) above the transparent conductive oxide layer 2330, and exposing, etching, and then peeling off the transparent conductive oxide layer 2330 to form patterned second conductive parts 233.

Figure 10:
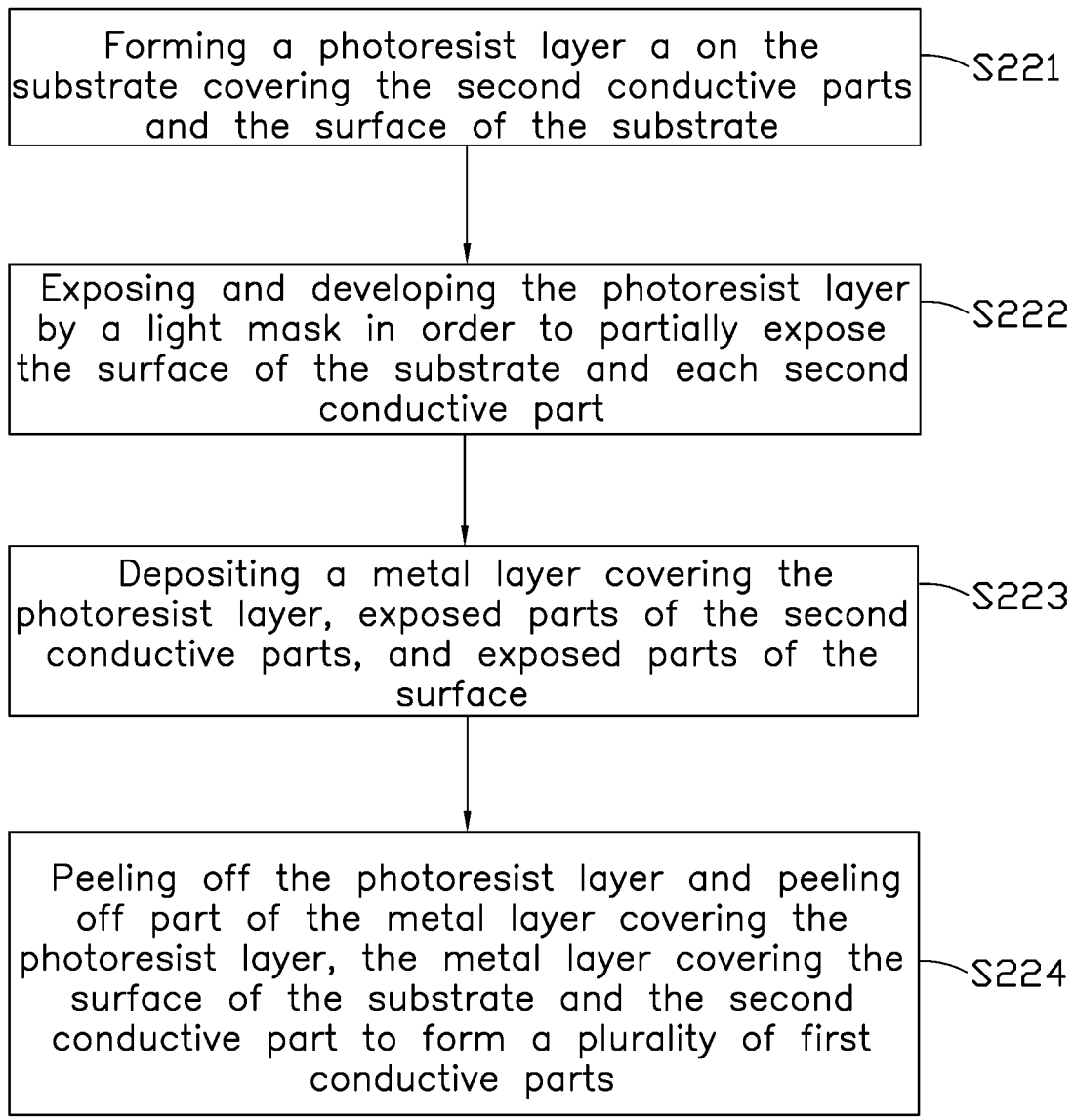
FIG. 10 illustrates step S22 in the method of FIG. 9.
Figure 11:
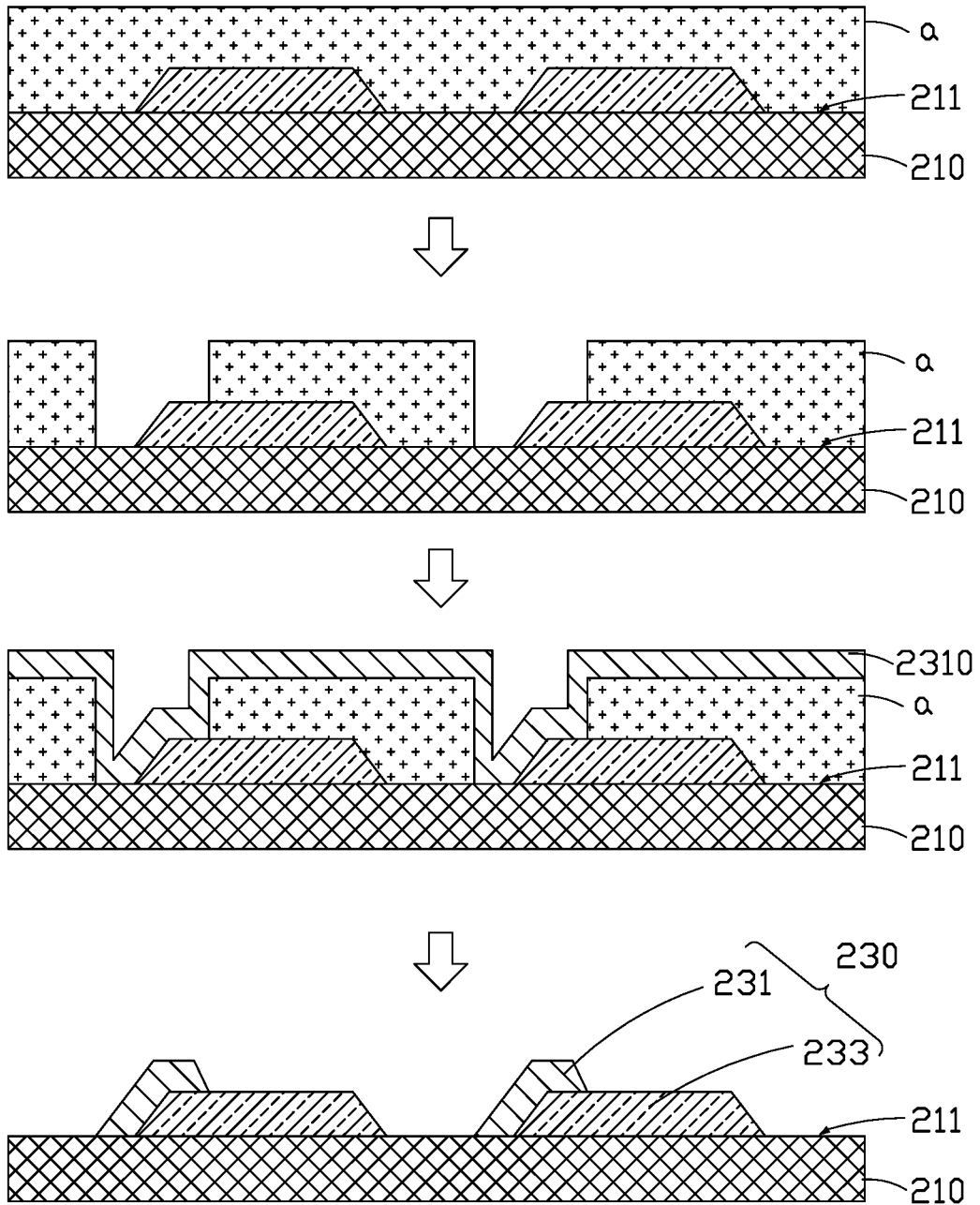
FIG. 11 illustrates cross-sectional views in different stages of step S22 in FIG. 9.

In this embodiment, as shown in FIG. 10 and FIG. 11, the step S22 further includes step S221 to Step 224.

Step S221: forming a photoresist layer a on the substrate 110. The photoresist layer a covers the second conductive parts 233 and the surface 211 of the substrate 210.

Step S222: exposing and developing the photoresist layer by a light mask in order to partially expose the surface 211 of the substrate 210 and each second conductive part 233.

Step S223: depositing a metal layer 2310 to cover the photoresist layer a, the exposed parts of the second conductive parts 233, and the exposed parts of the surface 111.

Step S224: peeling off the photoresist layer a, and peeling off part of the metal layer 2310 covering the photoresist layer a at the same time. The metal layer 2310 covers both the surface 211 of the substrate 210 and the second conductive part 233 to form a plurality of first conductive parts 231.

Compared with the first embodiment, the method for making the display panel 200 of this embodiment avoids the first conductive parts 231, which are opaque, from being covered by the projection of the LED 250 by directly setting the second conductive parts 233 on the substrate 210 and making a direct electrical connection of the LED 250 to the second conductive part 233. That is, the projection area of each first conductive part 231 on the surface 211 of the substrate 210 is less than that of the second conductive part 233 on the surface 211 of the substrate 210, thereby improving the light transmittance of the display panel 200. By setting the second conductive part 233 and the first conductive part 231 to be in parallel with the LED 250, overall resistance of the conductive component 230 with respect to the LED 250 is reduced, thereby reducing the impedance.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A display panel comprising:
    a substrate;
    a plurality of conductive components on a surface of the substrate, the plurality of conductive components being spaced apart from each other, each of the plurality of conductive components comprising a first conductive part and a second conductive part, the second conductive part being electrically connected to the first conductive part, and a projection of the second conductive part on the surface at least partially overlapping a projection of the first conductive part on the surface of the substrate;
    a plurality of light-emitting diodes, each of the plurality of light-emitting diodes comprising a binding electrode, and the binding electrode being electrically connected to the second conductive part;
    wherein the first conductive part is made of metal; the second conductive part is made of a transparent conductive oxide; the binding electrode is made of metal; and a eutectic material is formed between the second conductive part and the binding electrode.

2. The display panel of claim 1, wherein the first conductive part is on the surface of the substrate; the second conductive part is on a side of the first conductive part away from the substrate and partially covers the first conductive part.

3. The display panel of claim 2, further comprising an insulating layer, wherein the insulating layer is on the surface of the substrate and partially covers the first conductive part of each of the plurality of conductive components; the insulating layer defines a plurality of positioning holes; the first conductive part of each of the plurality of conductive components is exposed from the insulating layer by a corresponding one of the plurality of positioning holes.

4. The display panel of claim 3, wherein the second conductive part of each of the plurality of conductive components is in the corresponding one of the plurality of positioning holes and covers the first conductive part; each of the plurality of light-emitting diodes is in the corresponding one of the plurality of positioning holes.

5. The display panel of claim 1, wherein the second conductive part is on the surface of the substrate; the first conductive part is on a side of the second conductive part away from the substrate and partially covers the first conductive part; the first conductive part extends from a side of the second conductive part to contact the surface of the substrate.

6. The display panel of claim 5, wherein each of the plurality of light-emitting diodes is connected to a portion of the second conductive part not covered by the first conductive part.

7. The display panel of claim 6, further comprising an insulating layer, wherein the insulating layer is on the surface of the substrate, the insulating layer completely covers the second conductive part of each of the plurality of conductive components, and partially covers the first conductive part of each of the plurality of conductive components; the insulating layer defines a plurality of positioning holes; the second conductive part of each of the plurality of conductive components is exposed from the insulating layer by a corresponding one of the plurality of positioning holes; each of the plurality of light-emitting diodes is in the corresponding one of the plurality of positioning holes.

8. The display panel of claim 1, wherein each of the plurality of light-emitting diodes is a micro light-emitting diode or a mini light-emitting diode.

9. The display panel of claim 1, wherein each of the plurality of conductive components is bound to several of the plurality of light-emitting diodes.

10. A method of making a display panel, comprising:
providing a substrate;
forming a plurality of conductive components spaced apart from each other on a surface of the substrate, each of the plurality of conductive components comprising a first conductive part and a second conductive part, the second conductive part being electrically connected to the first conductive part, and a projection of the second conductive part on the surface of the substrate at least partially overlapping a projection of the first conductive part on the surface of the substrate; wherein the first conductive part is made of metal; the second conductive part is made of a transparent conductive oxide;
setting a plurality of light-emitting diodes on the substrate, and each plurality of light-emitting diodes comprising a binding electrode, the binding electrode being made of metal; and a eutectic material being formed between the second conductive part and the binding electrode to bind each of the plurality of light-emitting diodes to the second conductive part.

11. The method of claim 10, wherein forming the plurality of conductive components comprises:
forming a plurality of the first conductive parts spaced apart from each other on the surface;
forming an insulating layer covering the surface and the plurality of first conductive parts;
defining a plurality of positioning holes in the insulating layer, each of the plurality of positioning holes extending through the insulating layer to expose a corresponding one of the plurality of first conductive parts;
forming a transparent conductive oxide layer on the insulating layer, and patterning the transparent conductive oxide layer to form a plurality of second conductive parts; each of the plurality of second conductive parts being in the corresponding one of the plurality of positioning holes and covering and electrically connected to the second conductive part.

12. The method of claim 10, wherein forming the plurality of conductive components comprises:
forming a transparent conductive oxide layer on the surface of the substrate and patterning the transparent conductive oxide layer to form a plurality of second conductive parts spaced apart from each other;
forming a plurality of first conductive parts on the surface of the substrate, each of which partially covers the second conductive part and extends to the surface of the substrate;
forming an insulating layer covering the surface of the substrate, the plurality of first conductive parts and the plurality of second conductive parts;
defining a plurality of positioning holes in the insulating layer; each of the plurality of positioning holes exposing a corresponding one of the plurality of second conductive parts.

13. The method of claim 10, wherein forming the eutectic material between the binding electrode and the second conductive part comprises: a material of the binding electrode and a material of the transparent conductive oxide layer are mixed to form a eutectic material by thermal curing or hot pressing.

* * * * *